United States Patent [19]

English

[11] Patent Number: 4,568,886
[45] Date of Patent: Feb. 4, 1986

[54] AMPLITUDE COMPENSATED VARIABLE BANDWIDTH FILTER

[75] Inventor: James D. English, Aloha, Oreg.

[73] Assignee: Tektronix, Inc., Beaverton, Oreg.

[21] Appl. No.: 740,380

[22] Filed: Jun. 3, 1985

[51] Int. Cl.⁴ .............................................. H03F 3/04
[52] U.S. Cl. ................................... 330/303; 330/306
[58] Field of Search ............... 330/107, 109, 302, 303, 330/305, 306

[56] References Cited

U.S. PATENT DOCUMENTS 4,275,453 6/1981 Wagner .............................. 330/109

Primary Examiner—James B. Mullins
Assistant Examiner—G. Wan
Attorney, Agent, or Firm—Allston L. Jones; Francis I. Gray

[57] ABSTRACT

A constant amplitude, variable-bandwidth filter is provided having a variable resistor and a high-Q passive filter cascaded between a pair of amplifiers. The input amplifier having a low output impedance and the output amplifier having a low input impedance. As the resistance of the variable resistor is varied, the Q of the system varies and thus its bandwidth. The gain of the system also varies as the variable resistor is varied. To compensate for the gain variation, a current, equivalent to the value of the output voltage of the input amplifier divided by the value of the equivalent series resistance of the high-Q passive filter, is inserted at the node where the variable resistor and the high-Q passive filter are coupled one to the other. This results in a constant current at resonance being conducted by the high-Q passive filter, independent of the selected overall bandwidth of the filter.

8 Claims, 3 Drawing Figures

AMPLITUDE COMPENSATED VARIABLE BANDWIDTH FILTER

BACKGROUND OF THE INVENTION

The present invention relates to variable bandwidth filters, more particularly to those having means for maintaining the output amplitude constant as the bandwidth is varied.

There are many measurement conditions or devices for which it is desirable to have a variable bandwidth filter that produces an output signal having constant amplitude regardless of the selected bandwidth. A spectrum analyzer is one such device. The bandwidth of any bandpass filter can be varied by varying its loading, or Q, wherein $Q=\omega L/R$ and $BW \propto 1/Q$, however, unless compensated for, this also varies the amplitude of the output signal of the filter. Some prior art devices have the bandwidth and gain controls ganged, but this is undesirable since a match between two separate circuits is hard to achieve.

Another approach was presented in U.S. Pat. No. 3,348,161 to Ranky. The configuration of the filter disclosed therein is shown in FIG. 1 in block diagram form. This design includes a cascaded arrangement of an input amplifier, a filter, a low input impedance amplifier with a bandwidth and gain control resistor in series with one of its input terminals and a shunt tank coupled to the other of its input terminals wherein the tank has a resonate frequency which is substantially the same as the center frequency of the filter. The output signal of the low input impedance amplifier and the signal at the junction of the tank and low input impedance amplifier is applied to a summer with the sum of the signals applied to the input terminal of a final high input impedance amplifier having both high impedance and low impedance output terminals. The operation of this circuit will be discussed in more detail below. This circuit is undesirable since its operation is adversely influenced by the noise voltage which is developed across $R_{BW}$, the variable resistor for controlling the gain of the low input impedance amplifier and the overall bandwidth of the filter.

It would be desirable to have a variable bandwidth filter which utilizes a single control element which, when varied, causes the variation of the bandwidth of the filter while maintaining the output amplitude constant without the undesirable effects introduced by the noise voltage of the prior art circuit. The amplitude compensated variable bandwidth filter of the present invention achieves each of the above-mentioned results.

SUMMARY OF THE INVENTION

In accordance with the illustrated embodiment, the present invention provides a method and apparatus for providing an amplitude compensated variable bandwidth filter having a single, user variable element which varies the overall bandwidth while maintaining the amplitude of the output signal substantially constant without being impaired by the noise voltage generated across the single, user variable element. The filter of the present invention includes an input amplifier having a low impedance output terminal which is coupled to one terminal of a high-Q passive filter via a variable resistor means for varying the Q of the filter as the resistance is varied. Also included in the filter of the present invention is a current source with its output current level being responsive to the output voltage of the input amplifier. That current is inserted into the node between the high-Q filter and the variable resistor. By so doing a constant amplitude current, at resonance, flows through the high-Q filter for all selected bandwidths, thus, maintaining the amplitude of the signal from the other terminal of the high-Q filter constant.

DESCRIPTION OF THE DRAWINGS

A full understanding of the present invention will be obtained from a detailed description given hereinbelow and the accompanying drawings. In addition, the drawings are given by way of illustration only, and thus are not limitative of the present invention. Further, wherein.

DESCRIPTION OF THE PREFERRED EMBODIMENT

Figure 1:
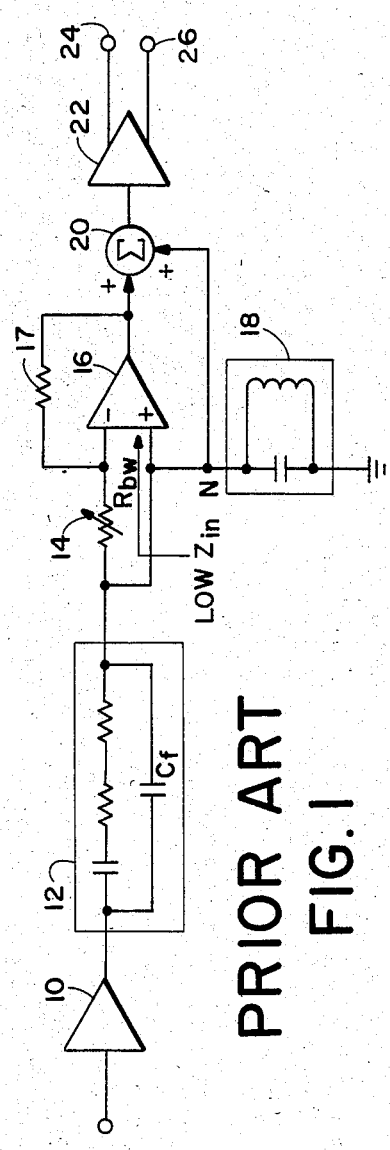
FIG. 1 is a block diagram of a prior art configuration of an amplitude compensated variable bandwidth filter.

Referring now to FIG. 1 of the accompanying drawings there is shown a block diagram of a prior art filter of the type of the present invention. That circuit consists of an input amplifier 10 followed by filter 12 which could be any high Q-bandpass filter (e.g. an RLC or crystal resonator). Following filter 12 is a low input impedance amplifier 16 with an LC tank circuit 18 shunted to ground, the tank circuit being tuned to the resonate frequency of filter 12 to neutralize the effect of the shunt capacitance of filter 12 (stray capacitance in an RLC filter and equivalent shunt capacitance in a crystal filter). Tank circuit 18 thus presents a very high impedance to ground to a signal within the resonant frequency range of the filter and a relatively low impedance to ground to a signal outside the frequency range of filter 12. In series between filter 12 and one of the input terminals of amplifier 16 is variable resistor 14 with its value designated as $R_{BW}$. The output signal from amplifier 16 and the signal at node N are next summed by summer 20, and then applied to a high input impedance amplifier 22 to provide an output signal on each of high and low impedance output terminals 24 and 26, respectively.

By increasing the resistance of resistor 14 ($R_{BW}$), the overall Q of the circuit drops, loading filter 12 and broadening its overall response, or bandwidth. At the same time, the increase in the value of $R_{BW}$ increases the gain of amplifier 16. By the proper choice of the fixed resistance value of feedback resistor 17, the variation of the gain of amplifier 16, as resistor 14 ($R_{BW}$) is varied, can be matched to compensate for the variation of the attenuation of filter 12 as it is loaded, so that the amplitude of the output signal of summer 20 remains constant, at resonance, over the range of bandwidth variations. The major shortcoming of this circuit configuration is the effect of the noise voltage developed across resistor 14 ($R_{BW}$). The square of that noise voltage is at least equivalent to:

$$V^2_{noise} = 4kTBR_{BW} \qquad (1)$$

where k is Boltzmann's constant,
T is the absolute temperature in °K.,
B is the bandwidth of the following circuit, and $R_{BW}$ is the resistance in ohms of resistor 14.
This noise voltage is then amplified by amplifier 16 together with the output signal from filter 12.

Figure 2:
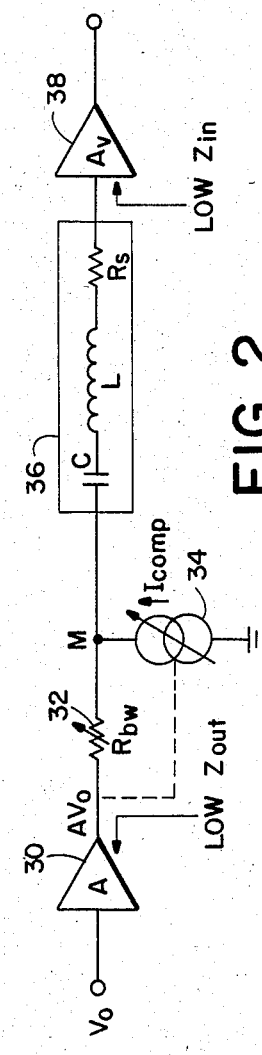
FIG. 2 is a block diagram of the amplitude compensated variable bandwidth filter of the present invention.

Referring next to FIG. 2 of the accompanying drawings there is shown a block diagram of the filter of the present invention. The circuit includes a cascade arrangement of a voltage source or amplifier 30, de-Qing resistor 32 ($R_{BW}$), filter 36, and an output amplifier 38. In addition, the is a variable current source 34 which injects a supplemental current into node M between de-Qing resistor 32 and filter 36. Amplifier 30 has a gain of A and a low output impedance, output amplifier 38 has a low input impedance, and filter 36 is any high Q bandpass filter (e.g., an RLC or crystal resonator).

As the resistance value of de-Qing resistor 32 is increased, the Q of the circuit drops and the bandwidth increases. In addition, the current through filter 36 drops, proportionally, thus resulting in a reduction in the voltage amplitude of the circuit response. Further, since the output impedance of input amplifier 30 is low, the reduction of the current necessary for the following circuit will allow its output voltage, $Av_o$, to increase proportionally. To compensate for the loss of amplitude of the output signal, variable current source 34, under the control of the output voltage ($Av_o$) of amplifier 30, injects a current $I_{comp}$, into the circuit at node M to maintain the resonant current through the equivalent resistance, $R_s$, of filter 36 constant regardless of the selected value of the de-Qing resistor 32, $R_{BW}$, and the overall bandwidth of filter 36. By so doing, the amplitude of the response of the overall circuit remains constant, independent of the bandwidth. To accomplish this result, the compensation current should be $$I_{comp} = Av_o/R_s \qquad (2)$$

where $I_{comp}$ is the current from current source 34, $Av_o$ is the value of the output voltage of amplifier 30, and
$R_s$ is the value of the equivalent series resistance of the filter 36, and the current through de-Qing resistor 32 is $$I_{R_{BW}} = Av_o/(R_s + R_{BW}). \qquad (3)$$

Thus, by superposition, the voltage at node M, at resonance, is equal to $Av_o$ which is independant of $R_{BW}$, the value of de-Qing resistor 32. Therefore, any noise voltage generated by the de-Qing resistor is shunted by $R_s$. Thus, the circuit of the present invention is its own noise filter. However, the overall bandwidth of the circuit is controlled by the de-Qing resistor as can be seen in equation (4).

$$BW = (R_{BW} + R_s)/2\pi L \qquad (4)$$

where L is the value of the equivalent inductance of filter 36.

To demonstrate the noise reduction of the circuit configuration of the present invention (FIG. 2) over the circuit configuration of the prior art (FIG. 1), we must look at the noise voltages at a similar point in each circuit. For that comparison, the noise voltages into the final stage of each circuit has been selected. In the prior art circuit of FIG. 1, the square of the noise voltage of the junction of resistor 14 and filter 12 is:

$$V^2_{noise} = kT/C_p \qquad (5)$$

where k and T are as in equation (1), and
$C_p$ is the value of the equivalent shunt capacitance of filter 12.

For the circuit of the present invention, the square of the noise voltage at the input terminal of amplifier 38 is:

$$V^2_{noise} = A_v kT/L \qquad (6)$$

where $A_v$ is the gain of amplifier 38,
k and T are as in equation (1), and
L is the value of the equivalent series inductance of filter 36.

The ratio of the squares of the noise voltages are thus:

$$\frac{\text{Equation (6)}}{\text{Equation (5)}} = \frac{(A_v kT/L)}{(kT/C_p)} = \frac{A_v C_p}{L} \qquad (7)$$

For reasonable values of the three variables in the ratio, a 60 db to 90 db reduction of noise in the circuit of the present invention over that of the prior art will be observed.

Figure 3:
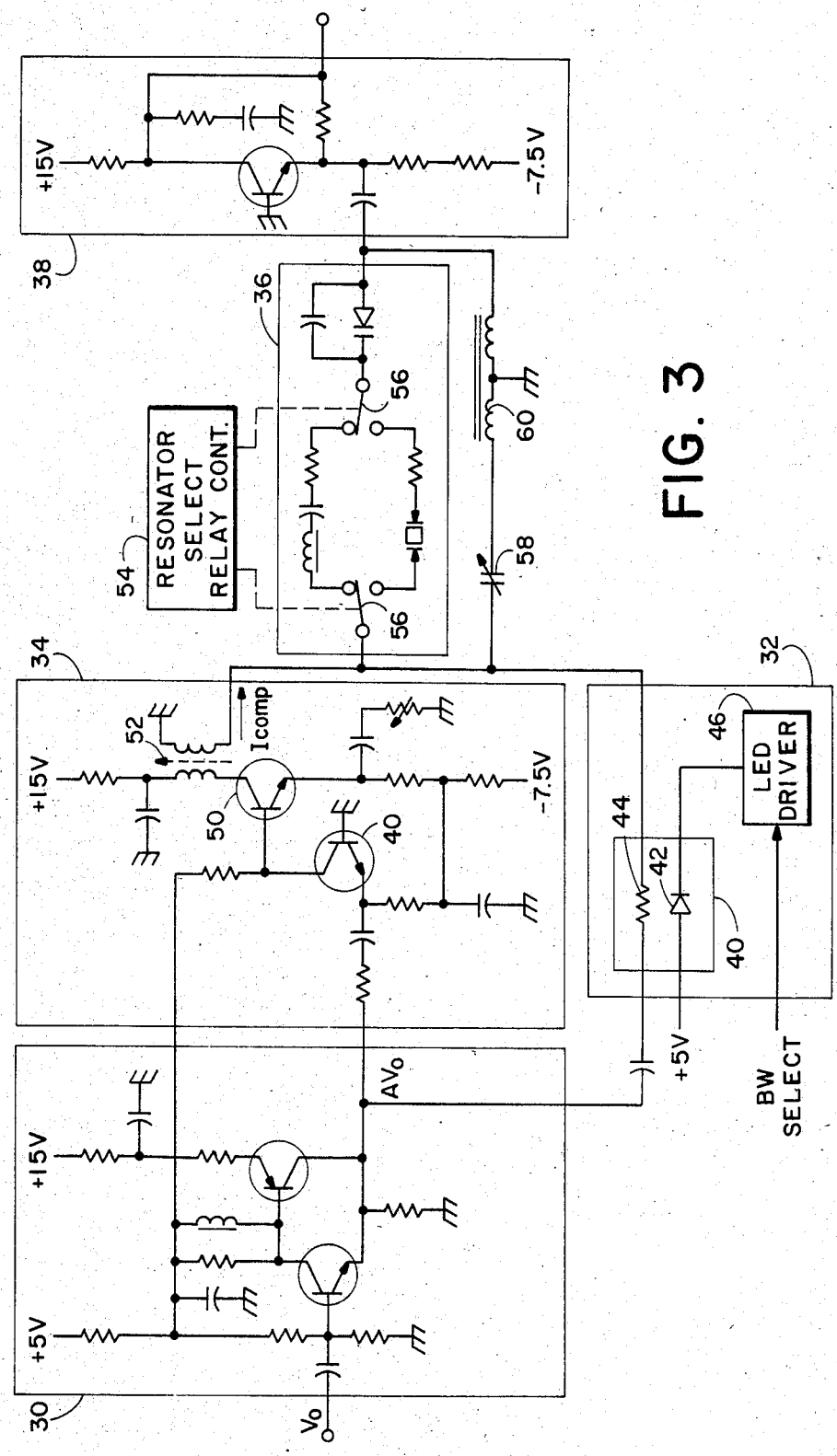
FIG. 3 is a schematic diagram of a circuit implementation of the present invention.

Referring now to FIG. 3 of the accompanying drawings there is shown a circuit implementation of the present invention. Low output impedance amplifier 30 of FIG. 2 is shown as a power source of ordinary design. De-Qing resistor 32 of FIG. 2 is implemented by a cadmium (CAD) cell 44 mounted together with an LED 42 in a common light tight enclosure 40. This combined device is available from several manufacturers. In addition, the LED is driven by an LED driver 46 of ordinary design in response to a user applied bandwidth select signal. Thus, as the illumination level of the LED 42 is varied, the resistance of the CAD cell 44 varies proportionally. The variable current source 34 is implemented with the output voltage, $Av_o$, of amplifier 30 being applied to a common base transistor 48 which is followed by a common emitter transistor 50 having some emitter degeneration, and an output transformer 52. The output current of the secondary winding of transistor 52 is $I_{comp}$ as discussed above. Filter 36 is shown providing the option of either an RLC or a crystal resonator selectable by the user by means of relay 56 and resonator select relay controller 54. Finally, output amplifier 38 is implemented with a common base transistor amplifier.

In addition, there is a neutralization circuit that includes a variable capacitor 58 in series with a 1:1 inverting transformer 60. This neutralization circuit is shunted across filter 36. The purpose of this neutralization circuit is to neutralize the effect of the shunt capacitance across filter 36, either stray capacitance for the RLC filter or the equivalent shunt capacitance for the crystal. Neutralization is achieved by selecting the value of capacitor 58 to be approximately equal to the capacitance shunting the filter. Transformer 60 changes the phase of the current flowing in capacitor 58 from that in the filter. Then the inductance of transformer 52 is selected to resonate with the combination of the undesirable filter shunt capacitance and capacitor 58 at the same frequency as filter 36. Thus, performing the desired neutralization similarly to tank circuit 18 in the prior art.

While this invention has been described in terms of one preferred embodiment, it is contemplated that persons reading the preceding descriptions and studying the drawings will realize various alterations, permutations and modifications thereof. It is therefore intended that the following appended claims be interpreted as including all such alterations, permutations and modifications as fall within the true spirit and scope of the present invention.

What is claimed is:

1. A constant amplitude, variable-bandwidth filter comprising:
   first amplifier means having a low output impedance for amplifying an input signal to the filter;
   a high-Q passive filter;
   variable resistor means serially coupling the first amplifier means to one terminal of the high-Q filter for varying the Q of the filter as the resistance is varied to select the desired bandwidth of the filter; and
   current source means responsive to the output signal of the first amplifier means for inserting a compensation current into the high-Q filter to maintain a constant amplitude current at resonance therethrough for all selected bandwidths.

2. A constant-amplitude, variable-bandwidth filter as in claim 1 further comprising second amplifier means having low input impedance for buffering the output signal from the other terminal of the high-Q filter.

3. A constant-amplitude, variable-bandwidth filter as in claim 1 wherein the value of the current supplied by the current source means is equivalent to the value of the output voltage to ground of the first amplifier means divided by the value of the equivalent series resistance of the high-Q passive filter so that the voltage to ground at the input of the high-Q passive filter at resonance is equal to the output voltage to ground of the first amplifier means.

4. A constant-amplitude, variable bandwidth filter as in claim 1 wherein the high-Q passive filter is a piezoelectric crystal.

5. A constant-amplitude, variable bandwidth filter as in claim 1 wherein the high-Q passive filter is an RLC filter.

6. A method of providing a constant-amplitude, variable-bandwidth filter, the steps comprising:
   a. cascading a variable resistor with a high-Q passive filter;
   b. generating a current equivalent to the voltage to ground on the terminal of the variable resistor furthest from the high-Q filter divided by the value of the equivalent series resistance of the high-Q filter; and
   c. injecting the current generated in step b. into the juncture of the items cascaded in step a.

7. A method of providing a constant-amplitude, variable-bandwidth filter as in claim 6 further comprising the steps of:
   d. varying the resistance of the variable resistor to vary the Q of the cascaded circuit and the bandwidth thereof.

8. A method of providing a constant-amplitude, variable bandwidth filter as in claim 6 further comprising the step of:
   e. obtaining the constant-amplitude, varied bandwidth signal from the terminal of the high-Q passive filter furthest from the variable resistor.

* * * * *